US006469613B2

(12) United States Patent
Miura

(10) Patent No.: US 6,469,613 B2
(45) Date of Patent: Oct. 22, 2002

(54) RESISTIVE ELEMENT, VARIABLE RESISTOR USING THE SAME AND METHOD OF MANUFACTURING THE RESISTIVE ELEMENT

(75) Inventor: Seiki Miura, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/931,932

(22) Filed: Aug. 20, 2001

(65) Prior Publication Data

US 2002/0024415 A1 Feb. 28, 2002

(30) Foreign Application Priority Data

Aug. 22, 2000 (JP) ....................................... 2000-250645

(51) Int. Cl.[7] ................................................ H01L 10/32

(52) U.S. Cl. ........................ 338/162; 338/174; 338/183; 338/307

(58) Field of Search ................................ 338/160, 162, 338/174, 183, 307

(56) References Cited

U.S. PATENT DOCUMENTS 3,206,702 A * 9/1965 Greenwood ................. 338/162
4,134,096 A * 1/1979 Denes ......................... 338/195
4,477,795 A * 10/1984 Henmi et al. ............... 338/163
4,479,106 A * 10/1984 Shimizu et al. ............. 338/160
6,023,217 A * 2/2000 Yamada et al. ............. 338/307
6,078,248 A 6/2000 Yagi
6,200,156 B1 * 3/2001 Hiraki et al. ............... 338/162

FOREIGN PATENT DOCUMENTS

GB 794 575 A 5/1958

* cited by examiner

*Primary Examiner*—Karl D. Easthom
(74) *Attorney, Agent, or Firm*—Wenderoth, Lind & Ponack, L.L.P.

(57) ABSTRACT

A resistive element includes a resistive film disposed on an insulating film, a current collector disposed apart from the resistive film at a given space, and an electrode conductive to the resistive film and the collector respectively. The insulating board is punched to form slits which split the electrode. The slits allow the resistive element to maintain creepage distances between the electrode. The resistive element accommodates downsizing requirement while restraining silver migration for eliminating shorts between the electrodes. As a result, a highly reliable resistive element is obtainable.

8 Claims, 10 Drawing Sheets

RESISTIVE ELEMENT, VARIABLE RESISTOR USING THE SAME AND METHOD OF MANUFACTURING THE RESISTIVE ELEMENT

FIELD OF THE INVENTION

The present invention relates to a resistive element used, e.g., as a position sensor which detects a position of a moving mechanism of various electronic apparatuses, and it also relates to a variable resistor using the resistive element, and a method of manufacturing the resistive element.

BACKGROUND OF THE INVENTION

Electronic apparatuses have been required downsizing land cost reduction for years. This market situation entails increasing a number of cases where a variable resistor type position-detecting-sensor is desirably used for detecting a moving mechanism of an electronic apparatus. The variable resistor employs a resistive element, and a dc constant voltage is regularly applied across the variable resistor. The position detecting sensor is required to be small, and yet, have a wide effective range.

The conventional resistive element, the variable resistor using the element and a method of manufacturing the element are described with reference to FIG. 9 and FIG. 10. FIG. 9 is a plan view of resistive element 5 employed in a conventional rotary variable resistor. In FIG. 9, insulating board 1 is made of, e.g., phenolic resin. Horseshoe-shaped resistive film 2 is printed on the surface of board 1. Ring-shaped current collector 3 is printed in conductive ink of silver system inside resistive film 2 at a given interval from film 2.

At lower side of terminal sections 2A and 2B of resistive film 2, electrodes 4A and 4B are printed. Printed electrode 4C extends from collector 3 and runs downward between electrodes 4A and 4B.

In order to give the variable resistor a predetermined variable range, printing procedure is regularly arranged as follows: First, collector 3 and electrodes 4A, 4B and 4C are printed simultaneously with good-conductive ink of silver system so that the respective electrodes can be electrically independent with each other. Then resistive film 2 is printed.

FIG. 10 is a schematic drawing of the rotary variable resistor using this resistive element 5. As shown in FIG. 10, electrodes 4A, 4B and 4C of resistive element 5 have respective terminals 6A, 6B and 6C for external use, and sliding contact 7 is integrated into element 5 so that contact 7 can resiliently slide on resistive film 2 as well as collector 3.

The rotary variable resistor using resistive element 5 having the structure discussed above is used as a sensor in the following manner: A dc constant voltage is applied across terminals 6A and 6B, and contact 7 slides on resistive film 2 from first terminal section 2A to second terminal section 2B (electrode 4B), thereby obtaining a desirable output voltage across terminals 6A and 6C.

However, in the conventional variable resistor discussed above, a potential difference is produced between terminals 6A–6C and between terminals 6C–6B when a dc constant voltage is applied for use. In this status, when ambient moisture is high, moisture in the air forms into dew on board 1. Then the silver on the anode side reacts with the water, and an inter-reaction between silver-ion and hydroxide is repeated before the silver travels on the surface of board 1 to the cathode side, where cathodic reduction is performed and the silver is deposited. When the silver deposition progresses, the anode and cathode are finally shorted. This is called "silver migration", and the conventional variable resistor sometime has encountered this silver migration. A countermeasure against the silver migration is provided, i.e., electrodes 4A, 4B and 4C are desirably arranged with a given space between electrodes 4A–4C and between electrodes 4B–4C.

Since the electronic apparatuses are downsized due to the market requirement, the resistive element used in the variable resistor is also downsized and the spaces between electrodes are narrowed. Further, the sensor discussed above uses the resistive element in more cases, therefore, an improved resolution, i.e., better accuracy of position detection, is required. For this purpose, a wider operating range is required to the resistive element. In other words, the resistive film having narrower spaces between the electrodes disposed on both the terminal sections is required. However, it is difficult for the conventional resistive element to be downsized with a wider operating range and prevent the silver migration simultaneously.

SUMMARY OF THE INVENTION

The present invention addresses the problems discussed above, and aims to provide a downsized resistive element which can prevent silver migration when a dc constant voltage is applied for use and accommodate a wide range of rotary angle with ease. The present invention also provides a variable resistor using the downsized resistive element, and a method of manufacturing the element.

The resistive element of the present invention comprises the following elements:

(a) a sheet of resistive film disposed on an insulating board;

(b) a current collector disposed at a given interval from the resistive film; and (c) electrodes conductive to both the resistive film and the collector.

Slits for splitting the electrodes apart are formed by punching the insulating board. This structure allows the resistive element to maintain the creepage distances between the electrodes because of disposing the slits even if the spaces between the electrodes are narrowed. As a result, silver migration is regulated from occurring and shorts between the electrodes are eliminated. A highly reliable resistive element is thus obtainable.

A method of manufacturing the resistive element of the present invention comprises the following steps:

(a) forming an integrated electrode and a current collector on an insulating board, the integrated electrode including a plurality of electrodes for external use;

(b) forming a sheet of resistive film, at least of which one terminal section overlying on the integrated electrode, and having a given interval from the collector; and (c) punching the insulating board to form slits at given places.

Step (c) splits the integrated electrode apart and forms a first electrode conductive to the terminal section as well as a second electrode conductive to the collector, both the electrodes being independent with each other electrically.

This method can adopt a printing process and a punching process, both the processes are advantageous for continuous production, which results in volume production at a low cost, in addition to regulating the silver migration and eliminating shorts between the electrodes. The downsized and quality resistive element with high reliability is thus obtainable.

DETAILED DESCRIPTION OF THE INVENTION

The resistive element of the present invention comprises the following components:

(a) a sheet of resistive film disposed on an insulating board;

(b) a current collector disposed away from the film at a given interval;

(c) electrodes disposed at an end of the resistive film and an end of the current collector, the electrode being for external use and made of good-conductive material of silver system; and slits are punched out through the board for spacing the electrodes apart.

The variable resistor of the present invention uses this resistive element, and terminals for external use are rigidly coupled to the respective electrodes of the resistive element. A contact for sliding on the current collector as well as the resistive film is provided, and is slid by an operating unit.

A method of manufacturing the resistive element of the present invention comprises the following steps:

(a) printing a current collector and a plurality of electrodes for external use unitarily on an insulating board in good-conductive ink; then (b) printing a sheet of horseshoe-shaped resistive film such that terminal sections are provided on the electrodes and the film maintains a given interval from the collector; and finally (c) punching the electrodes to form slits at given places on the electrodes.

Through these steps, an electrode of the collector and the other electrodes of the resistive film are formed maintaining electrical independence.

Another method of manufacturing the resistive element of the present invention comprises the following steps:

(a) printing a section to be a plurality of electrodes for external use and a ring-shaped current collector on an insulating board in good-conductive ink; then (b) printing a sheet of ring-shaped resistive film concentric with the ring-shaped collector on the section to be the electrodes; and finally (c) punching the board at given places to form slits.

Through these steps, terminal sections of the resistive film are formed and an electrode of the collector and the other electrodes of the resistive film are formed maintaining electrical independence.

Exemplary embodiments of the present invention are demonstrated hereinafter with reference to the accompanying drawings.

First Exemplary Embodiment

Figure 1:
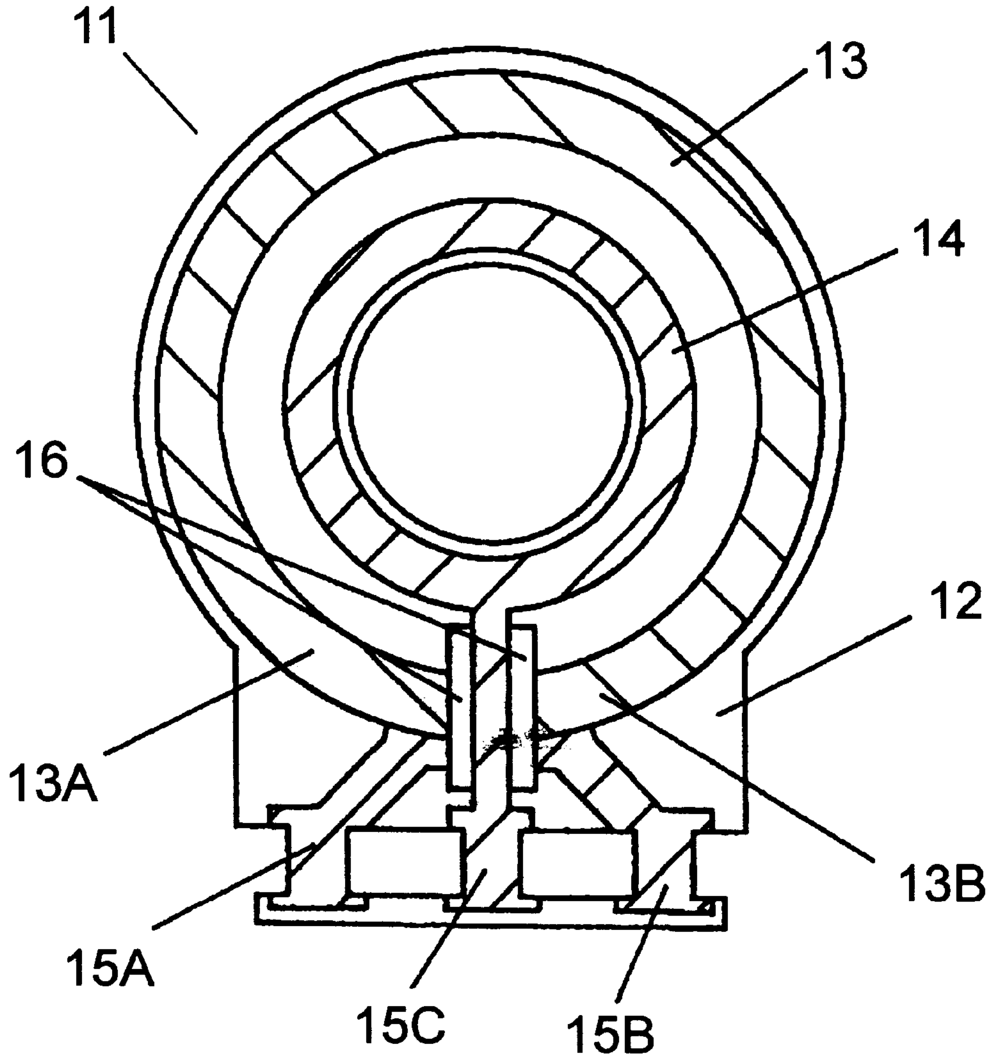
FIG. 1 is a plan view of a resistive element in accordance with a first exemplary embodiment of the present invention.

FIG. 1 is a plan view of a resistive element in accordance with the first exemplary embodiment of the present invention. In FIG. 1, resistive element 11 is formed by horse-shaped resistive film 13 printed on insulating board 12 and ring-shaped current collector 14 printed inside film 13. A given space is maintained between film 13 and collector 14. Board 12 is made of insulating resin such as polyethylene terephthalate (PET).

Beneath terminal section 13A of film 13, a terminal section of electrode 15A is printed. In the same manner, beneath terminal section 13B of film 13, a terminal section of electrode 15B is printed. Between two electrodes 15A and 15B (first electrode), electrode 15C (second electrode) of collector 14 extends through. In FIG. 1, hatching is provided on the resistive film, collector and electrodes to be identified with ease.

Between electrodes 15A, 15B and 15C, slits 16 are formed respectively. These two slits space electrodes 15A–15C apart. Respective slits 16 are formed approx. linearly along both sides of electrode 15C and run a long distance from the proximity of collector 14 to the proximity of the board end as shown in FIG. 1.

In other words, slits 16 are formed adjacent to the ends and corners of electrodes 15A–15C, because silver migration tends to occur at the ends and the corners. Eventually, slits 16 split respective electrodes 15A–15C away.

When slits 16 are formed by punching the board, the width of the slit, i.e., shorter side, is limited by the thickness of board 12. However, in the first embodiment, thin film made of insulating resin such as PET is used as board 12, therefore, the width of slits 16 can be extremely narrowed.

As discussed above, resistive element 11 has slits 16 between respective electrodes 15A–15C, thus when respective spaces between the electrodes are narrowed, it effects an equivalent advantage to the case where long creepage distances between the electrodes are prepared. As a result; silver migration is restrained from occurring. The first embodiment thus proves that resistive element 11 is downsized with ease, and high reliability is maintained when a dc constant voltage is applied across the electrodes.

Board 12 can be made of other material than PET, for instance, when material of low water-absorption is selected, the silver migration can be more strictly regulated. Board 12 is not necessarily a film type but can be a rigid type.

Figure 2A:
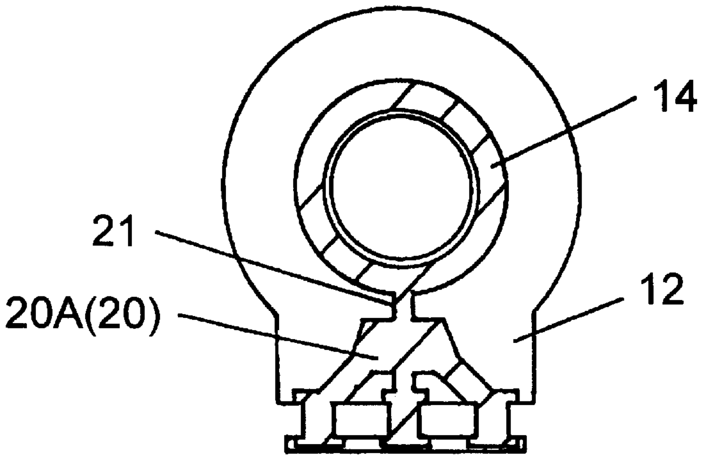
FIG. 2A illustrates a method of manufacturing the resistive element shown in FIG. 1, and specifically shows a status where a collector and a part of an electrode are printed on an insulating board.
Figure 2B:
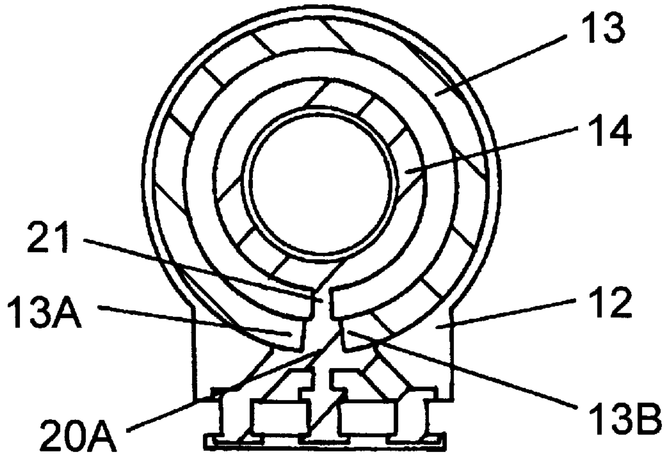
FIG. 2B shows resistive film printed.
Figure 2C:
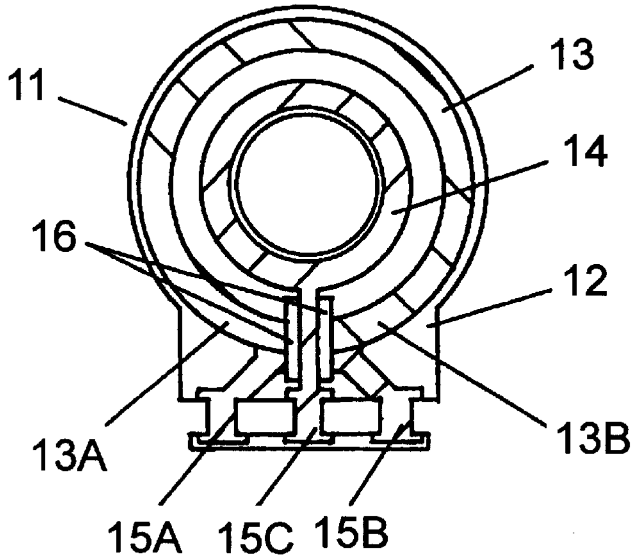
FIG. 2C shows slits formed.

A method of manufacturing resistive element 11 is demonstrated with reference to FIGS. 2A–2C which illustrate manufacturing processes of the resistive element 11 shown in FIG. 1.

First, as shown in FIG. 2A, film-like board 12 made of insulating material such as PET is prepared. The outward appearance of the board is defined to be a given shape. On this film, ring-shaped collector 14 and integrated electrode 20 having a fork-shaped tip formed of three branches are printed in good-conductive ink. The three branches open toward the end of board 12. Linear section 21 links integrated electrode 20 to collector 14, so that electrode 20 and collector 14 are printed unitarily.

Next, as shown in FIG. 2B, horseshoe-shaped resistive film 13 is printed using resistive paste such that the following two conditions are satisfied: (1) both terminal sections 13A and 13B of resistive film 13 are printed above both the sides of root section 20A of integrated electrode 20 by given layers from both the sides, (2) resistive film 13 is printed maintaining a given interval from ring-shaped collector 14.

Finally, as shown in FIG. 2C, two slits 16 are provided by punching root section 20A of electrode 20, thereby splitting root section 20A into three sections. Electrodes 15A, 15B and 15C connected to terminal sections 13A, 13B and collector 14 respectively are thus formed.

At this time, if slit 16 shapes in a linear passage along linear section 21, a punch shape can be simplified and also terminal sections 13A and 13B of horseshoe-shaped resistive film 13 can be placed matching the edges of slits 16. As a result, resistive element 11 having a narrow space between terminal sections 13A and 13B is obtainable, so that a greater effective rotating angle is secured in a rotary variable resistor.

In the manufacturing process discussed above, only a printing process and a punching process are employed, which accommodates mass production as well as continuous production with ease. An insulating board having a larger size can be used, so that a plurality of patterns of the resistive element are repeatedly printed, then the slits and the outward appearance are punched simultaneously. This process results in the mass production of a quality resistive element at an inexpensive cost.

In the first embodiment, the following process is described, i.e., integrated electrode 20 is formed, and root section thereof is split to form electrodes 15A–15C. However, electrodes 15A–15C can be pre-printed maintaining electrically independence, then slits 16 can be provided between the respective electrodes.

Figure 3:
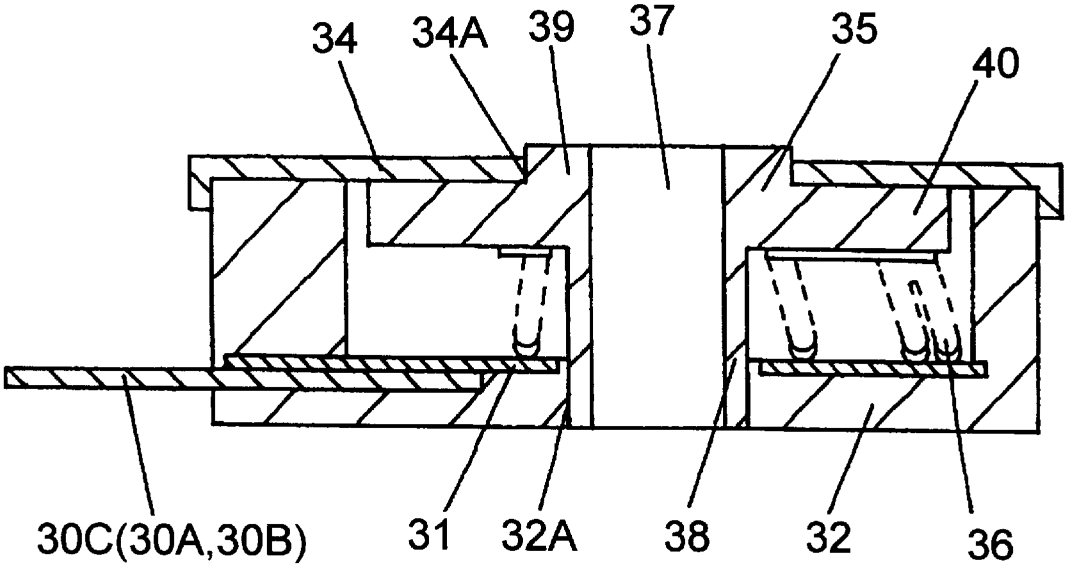
FIG. 3 is a cross section of a variable resistor using the resistive element shown in FIG. 1.
Figure 4:
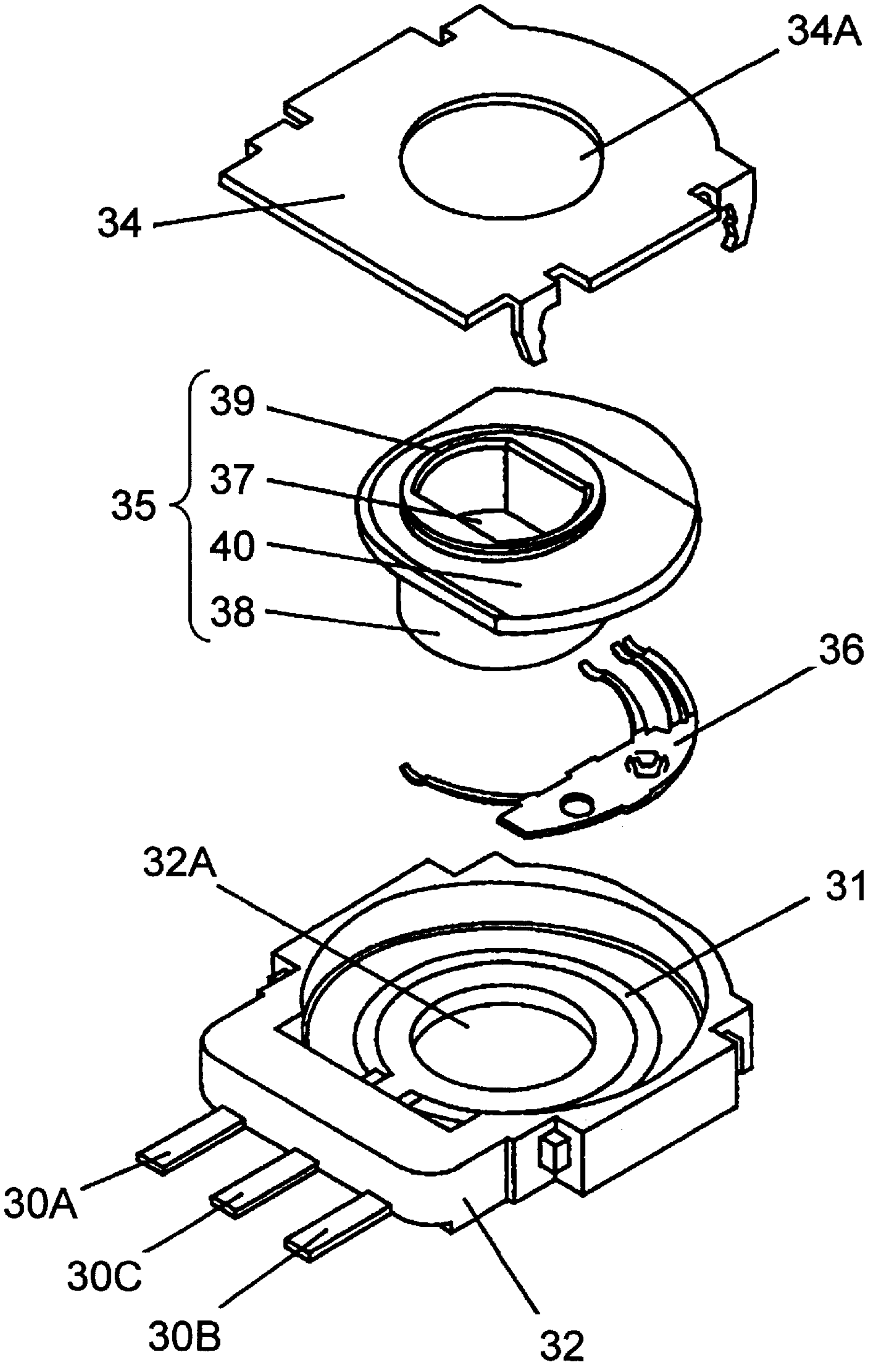
FIG. 4 is an exploded perspective view of the variable resistor shown in FIG. 3.

Next, the rotary variable resistor employing resistive element 11 in accordance with the first embodiment is demonstrated with reference to FIGS. 3 and 4. At respective electrodes 15A–15C of resistive element 11 shown FIG. 1, terminals 30A–30C are rigidly mounted by caulking, thereby forming terminals-inclusive resistive element 31 as shown in both the drawings. This terminals-inclusive resistive element 31 is insert-molded and fixed to the bottom of box-shaped case 32 made of resin such that the patterns printed on the board surface are exposed upward. When element 31 is insert-molded, resistive element 11 can be positioned using slits 16.

Figure 5:
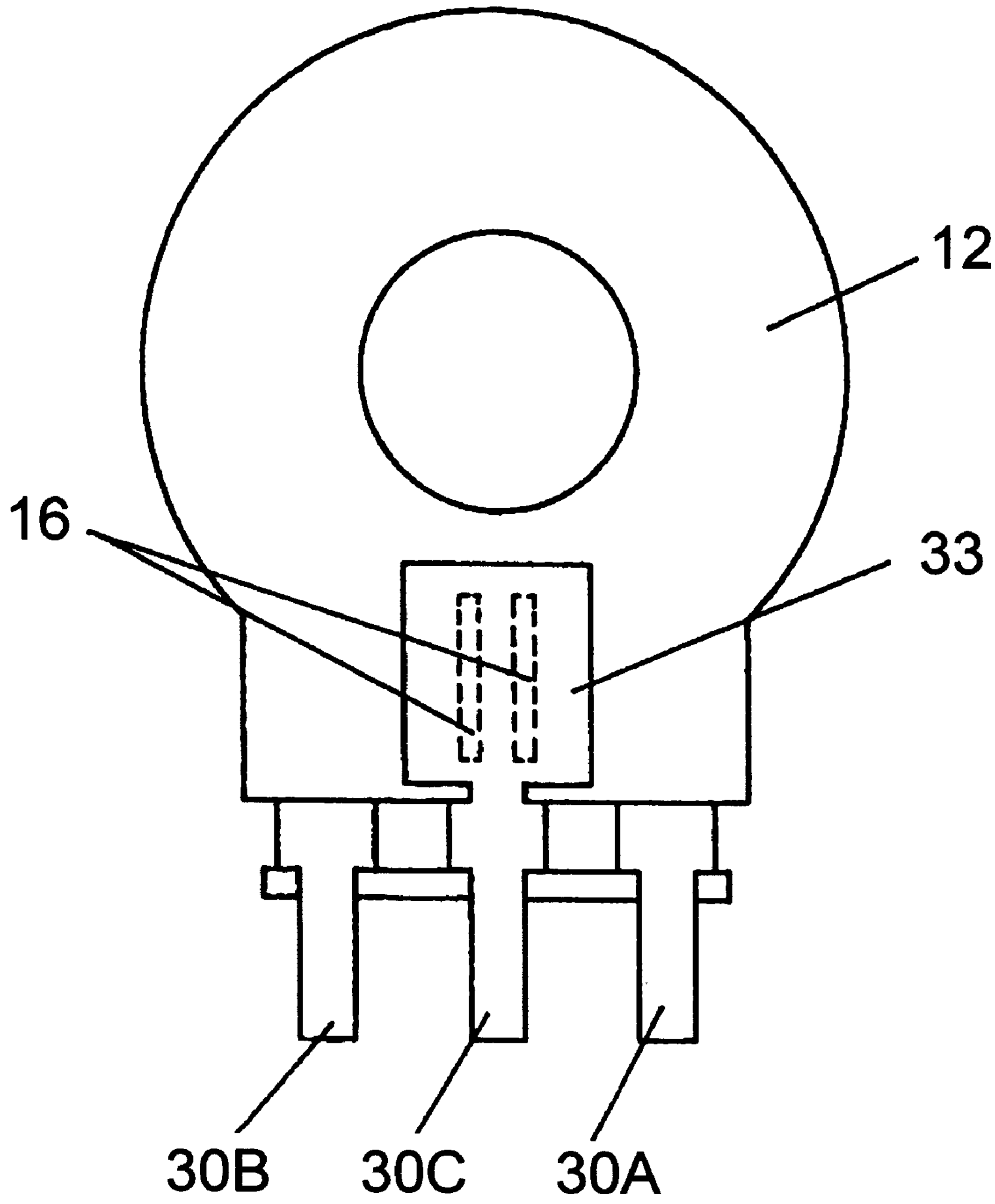
FIG. 5 is a back view of a resistive element including terminals, the element being an essential part of the variable resistor shown in FIG. 3.

As shown in the back view of the terminals-inclusive resistive element in FIG. 5, any one of electrodes 30A–30C, e.g., terminal 30C, is unitarily formed with reinforcing section 33 close to the back face of board 12, so that reinforcing section 33 can seal slits 16 from the back side of board 12. This structure prevents slits 16 from being filled with molding resin. In other words, when resistive element 11 is fixed to case 32 by means of insert-molding, the creepage distances between respective electrodes 15A–15C can be maintained, thereby restraining the silver migration from occurring.

In this case, reinforcing section 33 is desirably insulated from other two terminals, namely, terminals 30A and 30B; however, providing this reinforcing section 33 to a section can prevent this particular section from being deformed at insert-molding. As a result, a quality rotary-variable-resistor is obtainable with ease.

Cover 34 is mounted to case 32 such that cover 34 covers a box-shaped recess of case 32, and operating unit 35 is disposed in the inner space defined by cover 34 and the recess. Operating unit 35 is journaled by case 32 and cover 34.

Sliding contact 36 is brought into elastically contact with resistive film 13 and collector 14 of terminals-inclusive resistive element 31 exposed at the bottom of case 32. Sliding contact 36 is rigidly mounted to operating unit 35 so that sliding contact 36 can rotate together with operating unit 35.

As shown in FIG. 4, operating unit 35 has non-circular hole 37 at the center. Lower cylindrical section 38, namely a lower part of operating unit 35, is mated with center hole 32A of case 32. Upper cylindrical section 39 disposed coaxially with lower cylindrical section 38 is mated with center hole 34 of cover 34 which is disposed coaxially with center hole 32A. As a result, operating unit 35 is rotatably mounted maintaining horizontal condition.

When operating unit is in use, an operating shaft (not shown) is extended through non-circular hole 37 and revolved, thereby rotating operating unit 35. Sliding contact 36 fixed to operating unit 35 is thus moved to a given place. Operating unit 35 can be unitarily formed with the shaft if necessary.

The variable resistor employing resistive element 11 of the present invention is thus structured. When operating unit 35 is rotated as discussed above, sliding contact 36 moves to the given place, and the resistant value at that given place is taken out across predetermined two terminals out of three terminals 30A–30C.

In this variable resistor, since resistive element, 11—having the advantage equivalent to long creepage distances between the respective electrodes 15A, 15B, 15C—is used, silver migration can be restrained when a dc constant voltage is applied, and also the shorts between the e electrodes can be reduced. As a result, the variable resistor of the present invention can maintain high reliability for a long period, and have a wider effective-operating range while it keeps accommodating the downsizing requirement from the market.

Besides being applied to the rotary variable resistor discussed above, the resistive element of the present invention can be used in a sliding type variable resistor. In this case, the resistive film and the collector, which are generally disposed linearly and electrically independent, are disposed such that the space between the film and the collector is narrowed and yet the slits can increase the creepage distances between the respective electrodes. As a result, the silver migration can be restrained, and a sliding type variable resistor in a narrow shape is obtainable with ease.

Second Exemplary Embodiment

Figure 6:
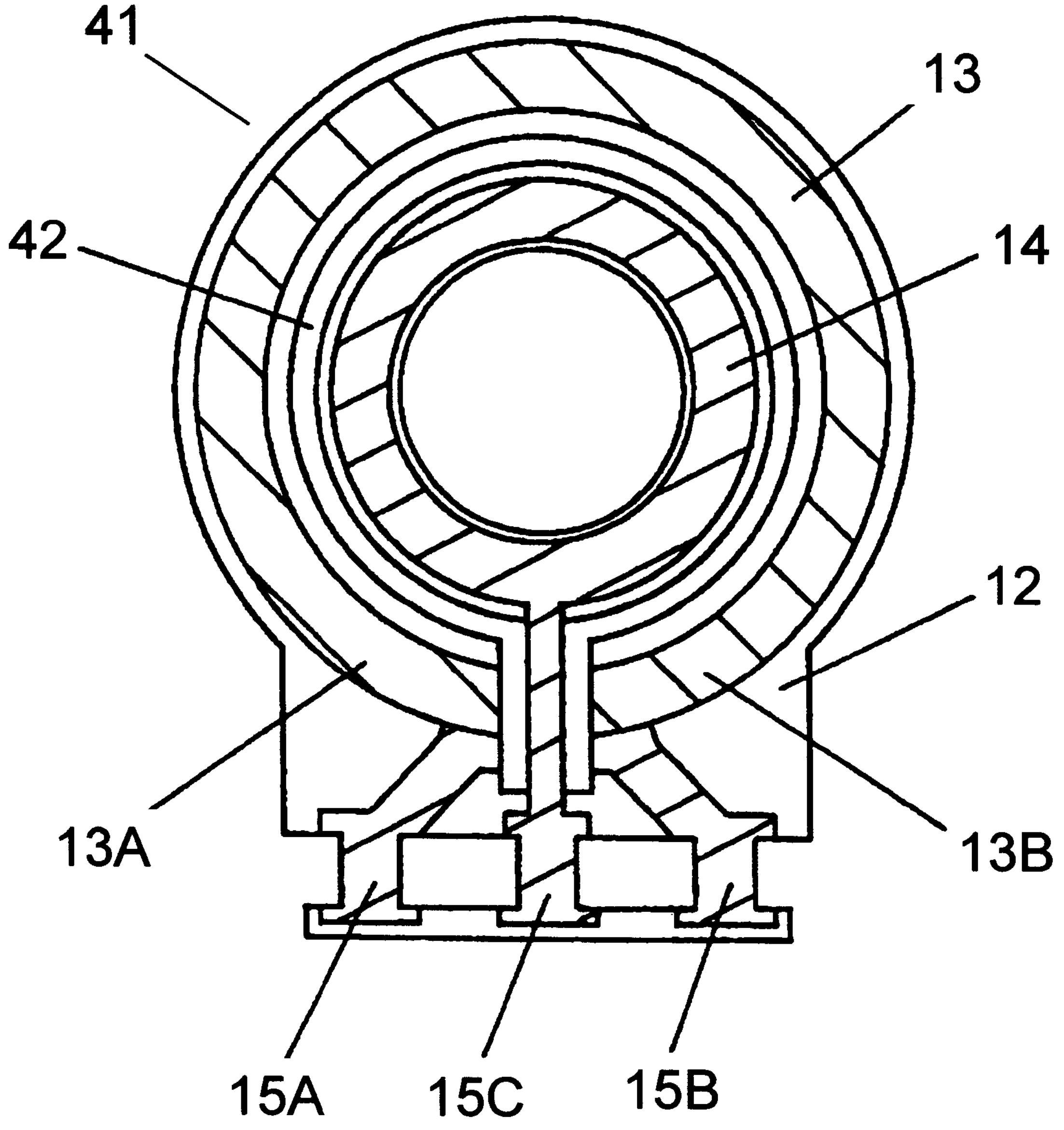
FIG. 6 is a plan view of a resistive element in accordance with a second exemplary embodiment.

FIG. 6 is a plan view of a resistive element in accordance with the second exemplary embodiment. As shown in FIG. 6, resistive element 41 in accordance with the second embodiment differs from resistive element 11 of the first embodiment in the shape of slit 42. Other elements remain the same as those in the first embodiment, thus the descriptions thereof are omitted here.

In resistive element 41 shown in FIG. 6, electrodes 15A and 15B overlie on both terminal sections 13A and 13B of horseshoe-shaped resistive film 13. Ring-shaped current-collector 14 is formed inside resistive film 13, and electrode 15C is coupled to collector 14. In this second embodiment, slit 42 splits up electrodes 15A–15C from each other, and also separates resistive film 13 from collector 14, both being spaced apart maintaining a given interval therebetween. In other words, slit 42 shapes in a horseshoe and is disposed between resistive film 13 and collector 14 concentrically with film 13 and collector 14, and further at the opening of the horseshoe, includes linear sections running from the ends of horseshoe toward the edge of board 12.

This structure allows resistive element 14 to restrain silver migration which might occur, depending on a condition of use, between collector 14 and resistive film 13. The resistive element is thus expected to have better quality.

The shape of slit 42 is described as a continuous one; however, a plurality of slits can be provided between resistive film 13 and collector 14. The resistive element in accordance with the second embodiment is applicable to the sliding type variable resistor. The variable resistor using this resistive element is provided with the better countermeasure against the sliver migration, therefore, when a dc voltage is applied thereto, better reliability can be expected.

Third Exemplary Embodiment

Figure 7:
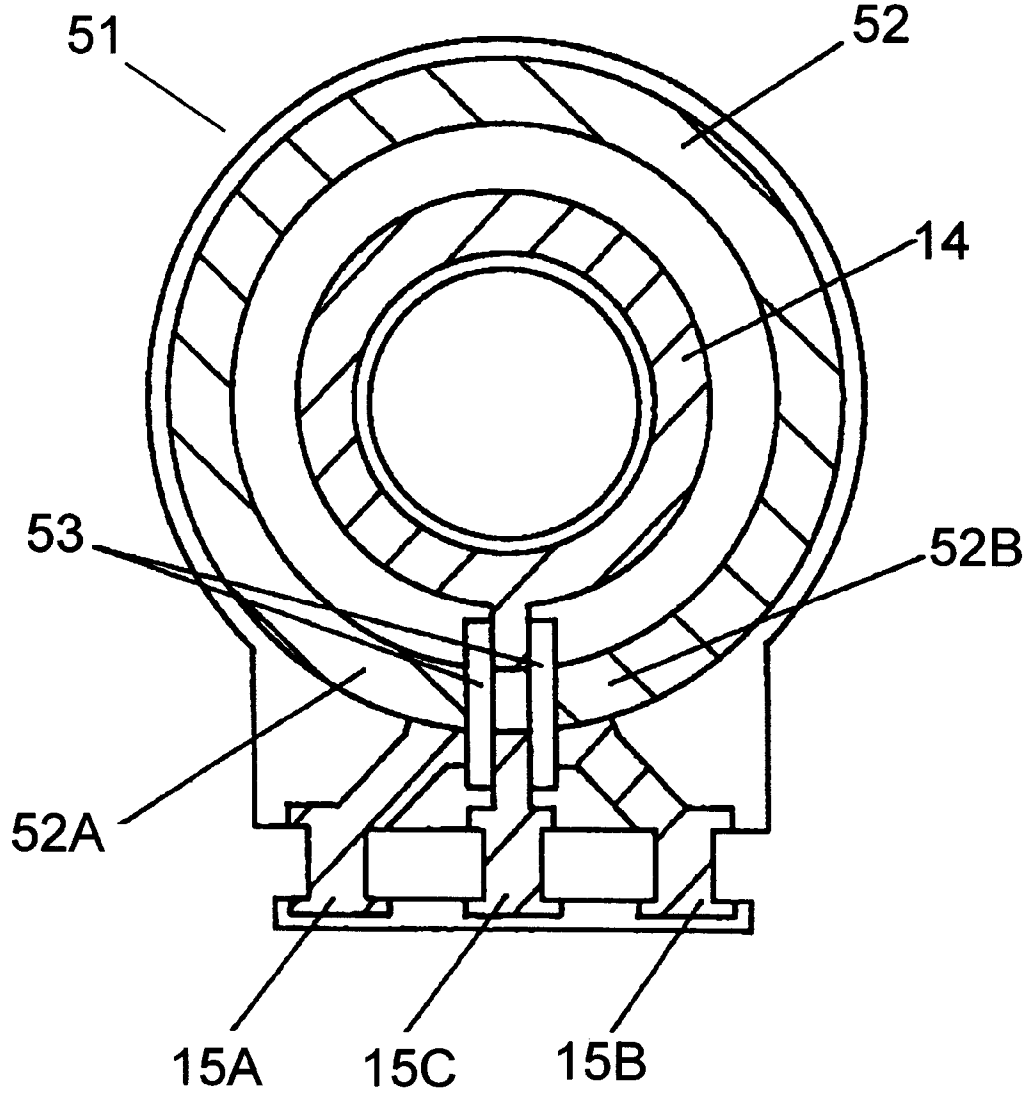
FIG. 7 is a plan view of a resistive element in accordance with a third exemplary embodiment.

FIG. 7 is a plan view of a resistive element in accordance with the third exemplary embodiment. As shown in FIG. 7, resistive film 52 overlies on the entire upper surface of electrodes 15A–15C, and slits 53 split up respective electrodes 15A–15C, thereby forming restive element 51 in accordance with the third embodiment.

Figure 8A:
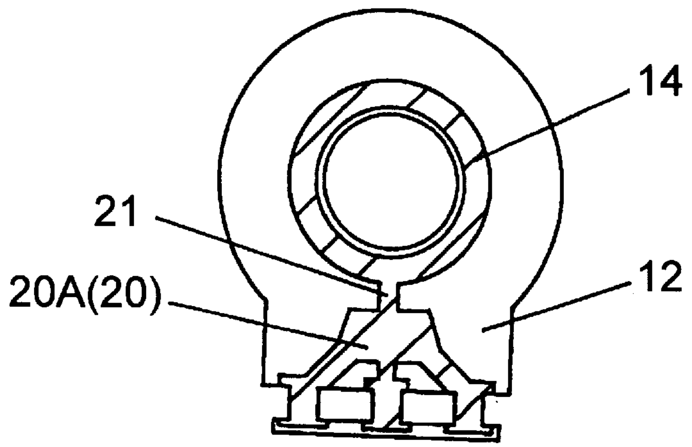
FIG. 8A illustrates a method of manufacturing the resistive element shown in FIG. 7, and specifically shows a status where a collector and a part of an electrode are printed on an insulating board.
Figure 8B:
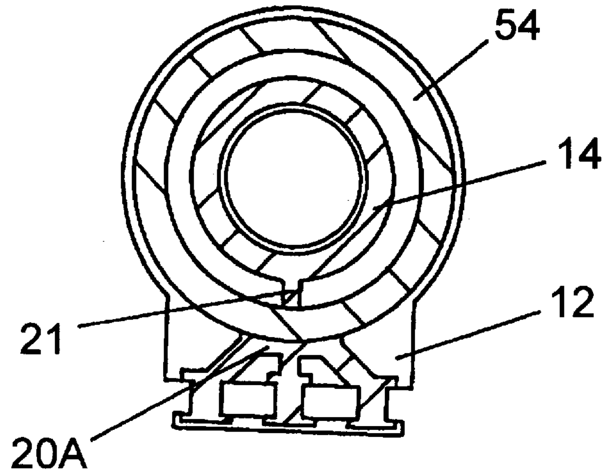
FIG. 8B shows resistive film printed.
Figure 8C:
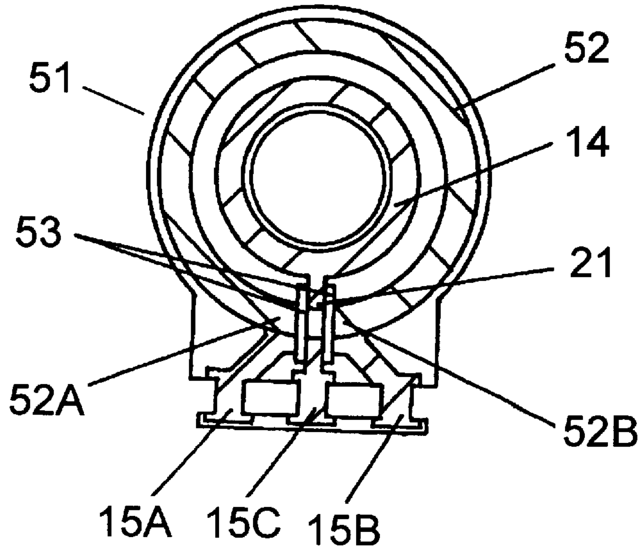
FIG. 8C shows slits formed.
Figure 9:
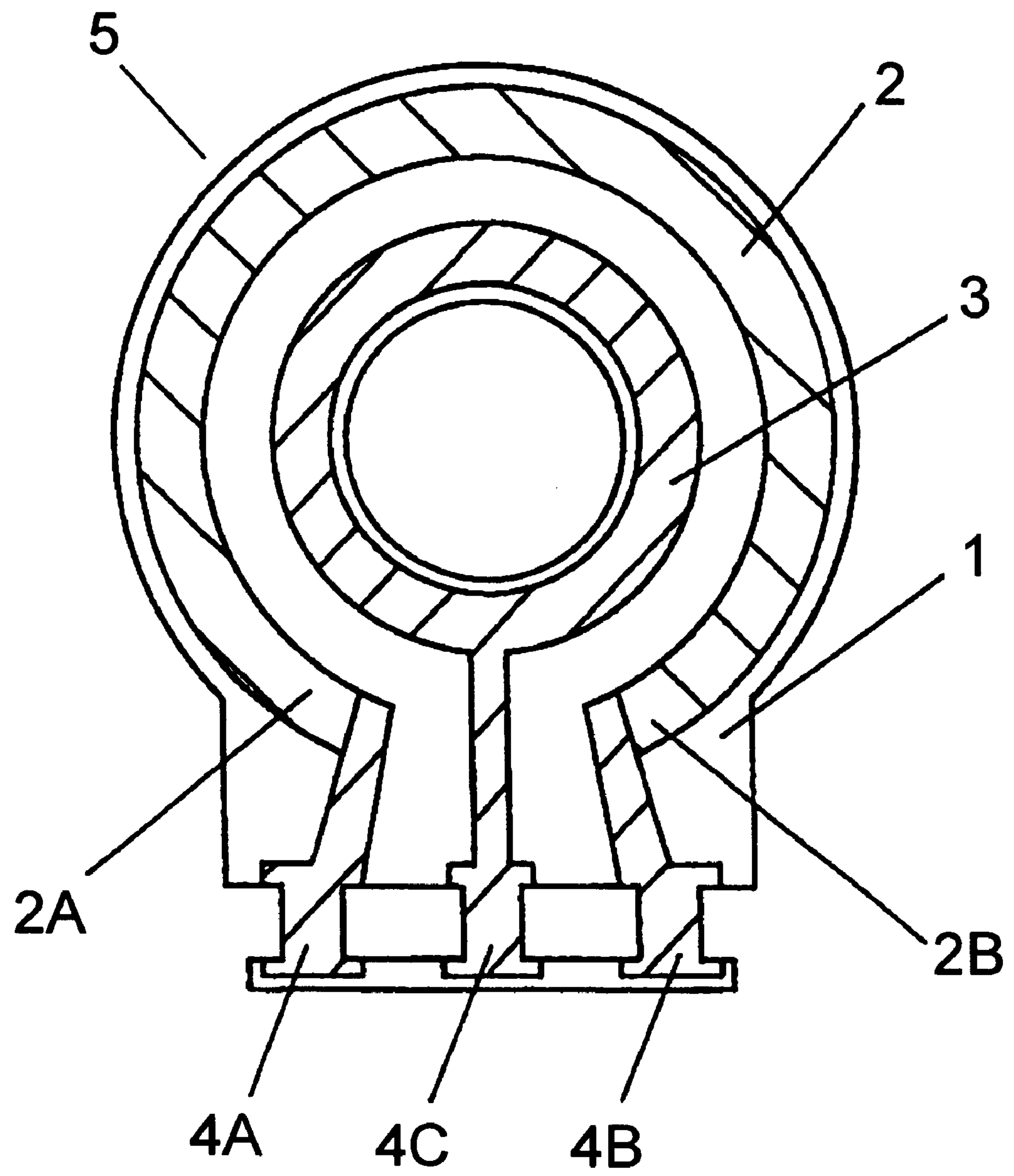
FIG. 9 PRIOR ART
FIG. 9 is a plan view of a conventional resistive element.
Figure 10:
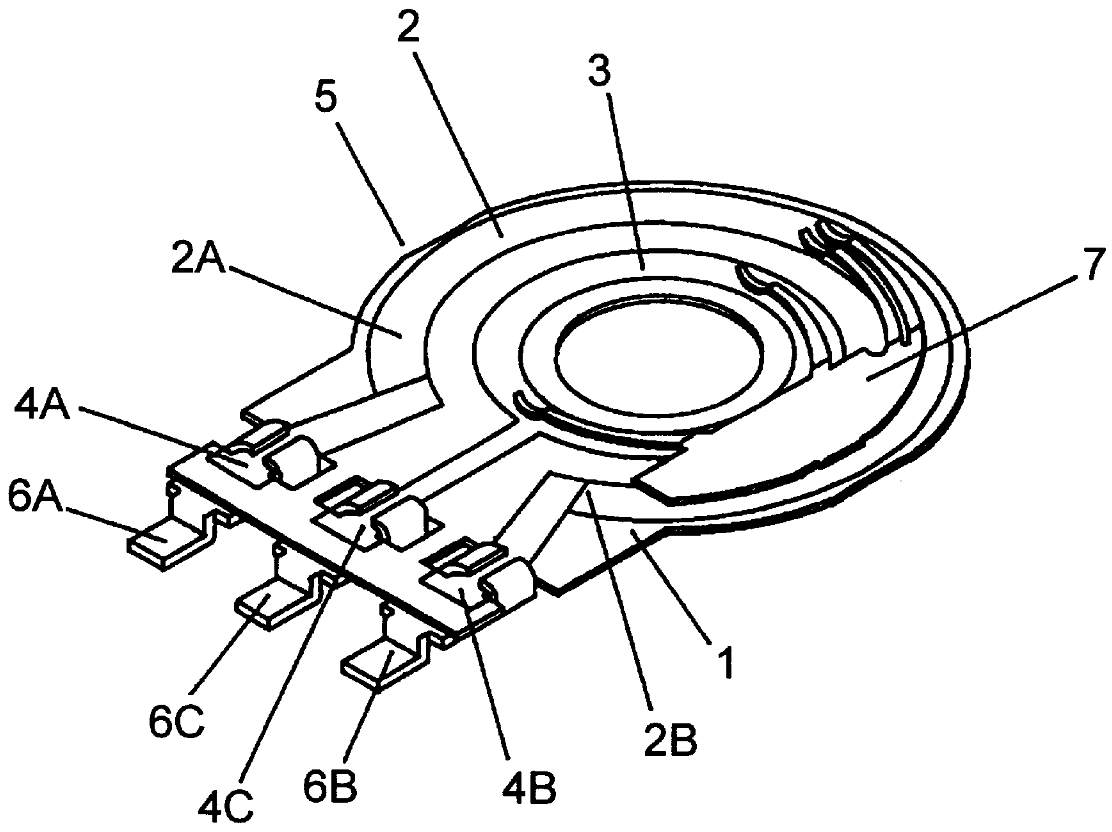
FIG. 10 PRIOR ART
FIG. 10 is a schematic diagram of a rotary variable resistor using the resistive element shown in FIG. 9.

A method of manufacturing resistive element 51 shown in FIG. 7 is demonstrated with reference to FIGS. 8A–8C. As shown in FIG. 8A, firstly, ring-shaped current collector 14, integrated electrode 20 with a fork-shaped tip having three branches, and linear section 21 which couples ring-shaped section to root section 20A of the fork-shape are unitarily printed on film-like insulating board 12 in good-conductive ink. The printing process is similar to that of the first embodiment. Film-like board 12 is made of insulating resin such as PET and the outer appearance is shaped into a given shape.

Next, as shown in FIG. 8B, resistive film 54 in a closed shape, e.g., a ring shape, is printed concentrically with ring-shaped collector 14 such that resistive film 54 runs on root section 20A, and film 54 is spaced from collector 14 at a given interval.

Finally, as shown in FIG. 8C, slits 53 are provided by punching root section 20A together with resistive film 54, so that the ring of resistive film 54 is split and electrodes 15A, 15B and 15C become electrically independent of each other. Electrodes 15A, 15B and 15C are coupled to terminal sections 52A and 52B of resistive film 52 and collector 14 respectively.

Ring-shaped resistive film 54 in accordance with the third embodiment can be printed in a simple pattern, so that print blur can be Reduced and also a pattern in a small diameter is printable with ease. Accordingly, the third embodiment proves that the present invention can accommodate small size products. Terminal sections 52A and 52B of resistive film 52 are formed by punching out slits 53, therefore, accurate positioning thereof can be expected, which is advantageously used to small size products.

The variable resistor employing the resistive element in accordance with the third embodiment can effect the advantage similar to that of the first embodiment.

The resistive element of the present invention, as discussed above, has slits which split respective electrodes. This structure produces the advantages similar to that of longer creepage distances between the respective electrodes, so that silver migration can be restrained when a dc voltage is applied to the resistive element. Slits can be formed by punching an insulating board with resulting accurate shape and positioning. Thus a resistive element—accommodating a greater and accurate operating angle, i.e., a greater effective operating range—can be manufactured efficiently with ease. Employing this resistive element can realize a small rotary variable resistor or a sliding type variable resistor in a narrow shape with ease.

What is claimed is:

1. A resistive element comprising:

(a) resistive film disposed on an insulating board;

(b) a current collector disposed apart from said resistive film at a predetermined interval; and (c) an electrode conductive with said resistive film and said collector respectively, wherein the insulating board has a slit for splitting said electrode apart.

2. The resistive element of claim 1, wherein said collector is made of good-conductive material of silver system.

3. The resistive element of claim 1, wherein the slit has a longer length than said electrode, and is extended to a space between said film and said collector.

4. The resistive element of claim 1, wherein said film runs on surface of said electrode and shapes in a closed form, and the slit extends through said film and splits said electrode apart.

5. The resistive element of claim 1, wherein the insulating board is made of resin film.

6. A variable resistor comprising:

(a) a resistive element including:

(a1) resistive film disposed on an insulating board;

(a-2) a current collector disposed apart from said resistive film at a predetermined interval; and (a-3) an electrode conductive with said resistive film and said collector respectively, wherein the insulating board has a slit for splitting said electrode apart, (b) terminals mounted to said electrode split; and (c) an operating unit for sliding a contact on said collector and said film.

7. The variable resistor of claim 6, wherein said electrode is made of good-conductive material of silver system.

8. The variable resistor of claim 6, wherein at least one of said terminals is provided with an reinforcing section disposed on a back side of the insulating board and is independent of another terminal electrically, and the slits are supported by the reinforcing section.

* * * * *